United States Patent
Ma et al.

(10) Patent No.: US 7,669,164 B1
(45) Date of Patent: Feb. 23, 2010

(54) HARDWARE AND SOFTWARE IMPLEMENTATION OF AN ELECTRONIC DESIGN IN A PROGRAMMABLE LOGIC DEVICE

(75) Inventors: Haibing Ma, Superior, CO (US); Roger B. Milne, Boulder, CO (US)

(73) Assignee: Xilinx, Inc., San Jose, CA (US)

( * ) Notice: Subject to any disclaimer, the term of this patent is extended or adjusted under 35 U.S.C. 154(b) by 393 days.

(21) Appl. No.: 11/732,611

(22) Filed: Apr. 4, 2007

(51) Int. Cl.
*G06F 17/50* (2006.01)

(52) U.S. Cl. ............................... 716/17; 716/2; 716/12; 716/18

(58) Field of Classification Search ............... 716/2, 716/12, 17, 18
See application file for complete search history.

(56) References Cited

U.S. PATENT DOCUMENTS

2002/0059054 A1* 5/2002 Bade et al. .................... 703/20

* cited by examiner

*Primary Examiner*—Thuan Do
(74) *Attorney, Agent, or Firm*—LeRoy D. Maunu

(57) ABSTRACT

Implementing an electronic design having software-implemented blocks and hardware-implemented blocks. A specification of the electronic design is created in response to selection of blocks from a library, and at least one of the blocks is available for implementation in a selectable one of a software implementation for an embedded processor on a programmable logic device (PLD) and a hardware implementation on the PLD. A specification of each block in a first subset is obtained from the library and translated into an execution function of the software implementation of the block. Peripheral functions are generated for connections between blocks in the first subset and blocks in a second subset, which are designated for a hardware implementation on the PLD. A program is generated that invokes each peripheral function and each execution function in an order determined from the interconnections between the blocks.

20 Claims, 5 Drawing Sheets

HARDWARE AND SOFTWARE IMPLEMENTATION OF AN ELECTRONIC DESIGN IN A PROGRAMMABLE LOGIC DEVICE

FIELD OF THE INVENTION

The present invention generally relates to implementing an electronic design in a programmable logic device using a high-level modeling system.

BACKGROUND

An electronic design may be developed in a high-level modeling system (HLMS) by selecting various blocks and specifying connections between the blocks. The HLMS may have a graphical user interface that includes windows for assembling the electronic design and for displaying libraries of icons for the blocks. A user of the HLMS may select the icons of certain blocks from the library window and position the selected icons in the assembly window using a pointing device, such as a mouse of a general purpose computer. The icons may have ports representing the inputs and outputs of the corresponding blocks, and the ports may be successively selected using the pointing device to specify an interconnection between the blocks.

The HLMS may be used to develop an electronic design at a high level of abstraction. A block from a library of the HLMS may have parameters that specify the details of the operation of the block, and the values of certain parameters may be automatically determined by the HLMS. For example, a block may have parameters that specify the data types and data rates of the ports of the block, and the specification of a data type and data rate for one port of a block may permit the HLMS to determine the data type and data rate for every other port of the block. In addition, after the data type and data rate are determined for a port of a block, the HLMS may be able to determine the data type and data rate of the ports of another connected block. Thus, the HLMS might determine the data type and data rate for every port of every block after a user of the HLMS has specified data types and data rates at a few important points in the electronic design.

Certain HLMS, such as System Generator available from Xilinx, Inc., may generate an implementation of the electronic design in a programmable logic device (PLD). A PLD may include one or more embedded processors that may be useful for implementing an electronic design. A user of the HLMS may choose to implement a portion of the electronic design in software executing on an embedded processor. However, the embedded processor may not have enough processing power to complete a step of executing the software within a required time period. The user of the HLMS may react to such insufficient processing power of the embedded processor by modifying the electronic design to implement some of the software functions in the hardware resources of the PLD. However, migrating functions from a software implementation to a hardware implementation, and vice versa, may be time-consuming and expensive.

The present invention may address one or more of the above issues.

SUMMARY OF THE INVENTION

The various embodiments of the invention provide a number of approaches for implementing an electronic design. In one embodiment, a method is provided for implementing an electronic design in a high-level modeling system (HLMS). The method includes creating a specification of the electronic design in the HLMS in response to user input. A plurality of blocks are selected from at least one library in response to the user input and the blocks are connected with a plurality of interconnections in response to the user input. At least one of the blocks is available for implementation in a selectable one of a software implementation for an embedded processor on a programmable logic device (PLD) and a hardware implementation on the PLD. A first subset and a second subset of the blocks of the electronic design are designated. Each block of the first subset is designated for a software implementation on the embedded processor and each block of the second subset is designated for a hardware implementation on the PLD. For each block of the first subset, a specification of the block is obtained from the at least one library and the specification is translated into an execution function of the software implementation on the embedded processor. For each interconnection of the electronic design that connects a block of the first subset and a block of the second subset, a peripheral function is generated for an interface that couples the embedded processor to the hardware implementation of the block of the second subset. A program is generated for the embedded processor that invokes each peripheral function and each execution function in an order determined from the interconnections between the blocks.

A program storage medium is provided in another embodiment. The program storage medium comprises a processor-readable device configured with instructions for implementing an electronic design in a high-level modeling system (HLMS). Execution of the instructions by one or more processors causes the one or more processors to perform operations including: creating a specification of the electronic design in the HLMS in response to user input, the creating of the specification including selecting a plurality of blocks from at least one library in response to the user input and connecting the blocks with a plurality of interconnections in response to the user input, wherein at least one of the blocks is available for implementation in a selectable one of a software implementation for an embedded processor on a programmable logic device (PLD) and a hardware implementation on the PLD; designating first and second subsets of the blocks of the electronic design, wherein each block of the first subset is designated for a software implementation on the embedded processor and each block of the second subset is designated for a hardware implementation on the PLD; for each block of the first subset, translating a specification of the block obtained from the at least one library into an execution function of the software implementation of the block on the embedded processor; for each of the interconnections of the electronic design that connects a block of the first subset and a block of the second subset, generating a peripheral function for an interface coupling the embedded processor to the hardware implementation of the block of the second subset; and generating a program for the embedded processor that invokes each peripheral function and each execution function in an order determined from the interconnections between the blocks.

A high-level modeling system (HLMS) is provided in another embodiment. The HLMS comprises means for creating a specification of the electronic design in the HLMS in response to user input, the means for creating of the specification including means for selecting a plurality of blocks from at least one library in response to the user input and means for connecting the blocks with a plurality of interconnections in response to the user input, wherein at least one of the blocks is available for implementation in a selectable one of a software implementation for an embedded processor on a programmable logic device (PLD) and a hardware implementation on the PLD; means for designating first and second subsets of the blocks of the electronic design, wherein each block of the first subset is designated for a software implementation on the embedded processor and each block of the second subset is designated for a hardware implementation on the PLD; means, responsive to each block of the first subset, for translating a specification of the block obtained from the at least one library into an execution function of the software implementation of the block; means, responsive to each of the interconnections of the electronic design that connects a block of the first subset and a block of the second subset, for generating a peripheral function for an interface coupling the embedded processor to the hardware implementation of the block of the second subset; and means for generating a program for the embedded processor that invokes each peripheral function and each execution function in an order determined from the interconnections between the blocks.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings, in which.

DETAILED DESCRIPTION

Figure 1:
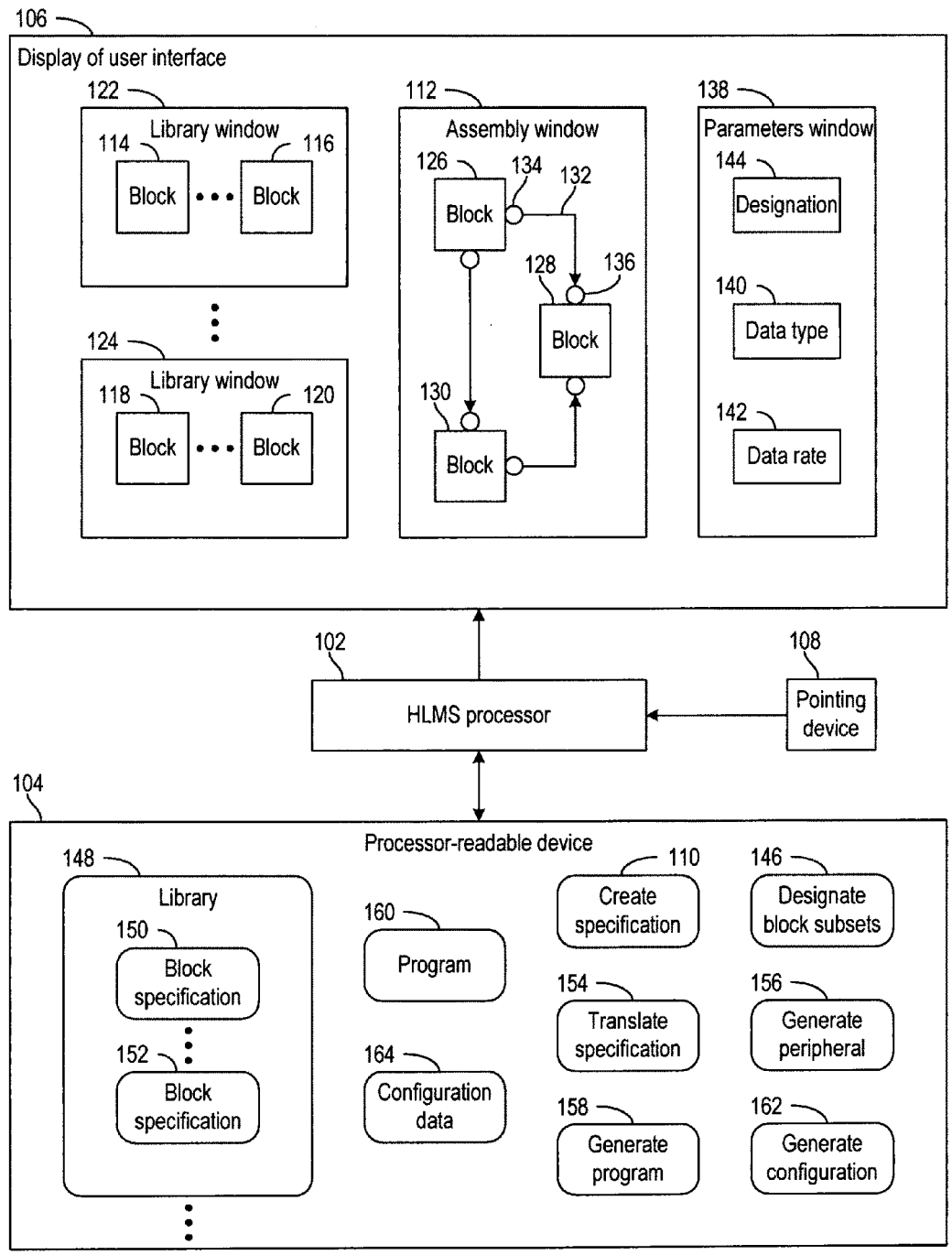
FIG. 1 is a block diagram of a high-level modeling system in accordance with various embodiments of the invention.

FIG. 1 is a block diagram of a high-level modeling system (HLMS) in accordance with various embodiments of the invention. The HLMS may include an HLMS processor 102 that accesses instructions and data stored in processor-readable device 104. The HLMS may present information and accept user input at a user interface that includes display 106 and pointing device 108.

Execution of the instructions in software module 110 may cause HLMS processor 102 to create a specification of an electronic design. The specification of the electronic design may be created by specifying the blocks of the electronic design and specifying the connections between the blocks.

The blocks of the electronic design may be specified in assembly window 112 by a user selecting certain of icons 114, 116, 118, and 120 from library windows 122 and 124, and copying the selected icons into assembly window 112. For example, a "drag and drop" operation may use the pointing device 108 to select icon 114 from library window 122 and copy this icon as icon 126 in assembly window 112; and additional "drag and drop" operations may select icon 118 from library window 124 and twice copy this icon as icons 128 and 130 in assembly window 112.

In one embodiment, library window 122 may include icons 114 and 116 representing blocks that are provided by a manufacturer of the HLMS for building various electronic designs. In addition, library window 124 may be a user library window that includes icons 118 and 120 representing blocks specified by a user in the HLMS. For example, icon 120 of the user library window 124 may represent the electronic design specified as shown in assembly window 112, and similarly icon 118 of the user library window 124 may represent a subsystem block of the electronic design that was previously created by the user in the HLMS.

The connections between the blocks of the electronic design may be specified in assembly window 112 by selecting certain ports of the icons 126, 128, and 130 and specifying a connection between the selected ports. For example, connection representation 132 may be specified by selecting and interconnecting ports 134 and 136 of respective icons 126 and 128. Each port of an icon may represent a particular input or output of the block that the icon represents.

The parameter window 138 may present information for various aspects of the electronic design and permit the information to be modified. A user of the HLMS may use pointing device 108 to select one of icons 126, 128, and 130 or one of the ports, such as ports 134 and 136, and the parameter window may present information for the selected icon or port. For example, port 134 may be selected by a user of the HLMS and subsequently parameters 140 and 142 may respectively present a data type and a data rate associated with port 134. The user of the HLMS may change parameters 140 and/or 142 and consequently change the data type and/or data rate associated with port 134. After port 134 is selected and parameters 140 and 142 are specified for the port 134, the HLMS may automatically update port 136 to have a corresponding data rate and data type because ports 134 and 136 are interconnected by connection representation 132.

In various embodiments of the invention, the parameters window 138 may also include a parameter 144 for designating the implementation of the blocks of an electronic design. Execution of the instructions in software module 146 may cause HLMS processor 102 to designate each block of an electronic design as either a software-implemented block or a hardware-implemented block. For example, a user of the HLMS may use pointing device 108 to select icon 128 in assembly window 112 and subsequently parameter 144 may present the current implementation selection in effect for the block represented by icon 128. The user of the HLMS may change parameter 144 to change the implementation selection for this block.

In certain embodiments of the invention, a designation of a software or hardware implementation may be made automatically for each block of the electronic design. The HLMS may designate the implementation of each block of the electronic design to fit the electronic design within the available software and hardware resources. For example, the HLMS may automatically designate the implementation of each block of the electronic design in response to one or more of the following: a processing rate of an embedded processor for the software implementation of the block, respective data transfer rates of a set of available interfaces for coupling an embedded processor to the hardware implementation of the block, respective data rates for the interconnections of the block, an estimate of hardware resource usage for each available interface in the set, and an estimate of hardware resource usage for the hardware implementation of the block.

In one embodiment of the invention, execution of instructions from software module 146 may cause HLMS processor 102 to automatically designate an initial assignment of each block to a software or hardware implementation. The initial assignment may apportion the blocks between software and hardware implementations to fit the electronic design within the available software and hardware resources. The available software resources may include the data processing power provided by an embedded processor of a programmable logic device (PLD), and the available hardware resources may include programmable logic and interconnect resources of the PLD. In addition, the execution of instructions from software module 146 may cause HLMS processor 102 to permit a user of the HLMS to modify the initial assignment using designation 144 of parameters window 138.

While certain of the blocks of an electronic design may have only a software implementation or only a hardware implementation, generally at least one of the blocks of an electronic design may be implemented in both software and hardware. For the blocks of the electronic design that may be implemented in both software and hardware, the user may designate which implementation is used in the electronic design or the implementation may be designated automatically by the HLMS. It will be appreciated that all of the blocks of a particular electronic design may have a selectable implementation in either software or hardware.

The processor-readable device 104 may include a library 148 including block specifications 150 and 152. Library window 122 may display icons 114 and 116 that have respective specifications 150 and 152 in library 148 of processor-readable device 104.

The processor-readable device 104 may include software module 154 for creating a software implementation for each block that is designated for a software implementation. For example, if icon 114 having block specification 150 is selected for icon 126 corresponding to a block that is designated for a software implementation, then the block specification 150 from library 148 may be translated into one or more software functions for implementing the block of the electronic design.

For each interconnection of the electronic design that connects a block designated for a hardware implementation and a block designated for a software implementation on an embedded processor, an interface may be selected for coupling the embedded processor to the hardware implementation. The processor-readable device 104 may include software module 156 for generating a peripheral function for controlling the interface.

The processor-readable device 104 may include a software module 158 for generating a program that implements the electronic design in software cooperating with a hardware implementation of one or more blocks of the electronic design. Execution of instructions from software module 158 may cause HLMS processor 102 to generate the program and store the program 160 in the processor-readable device 104.

In one embodiment of the invention, the processor-readable device 104 may include a software module 162 for generating configuration data, and a PLD may implement the electronic design when the PLD is programmed with the configuration data. Execution of instructions from software module 162 may cause HLMS processor 102 to generate the configuration data and store the configuration data 164 in the processor-readable device 104. The configuration data 164 may include the program 160 for initializing one or more memories of the PLD. Thus, the configuration data 164 may fully implement the electronic design, with designated blocks of the electronic design implemented in the programmable logic and interconnect resources of the PLD and the remaining blocks of the PLD implemented in software that is fetched from the memories and executed by an embedded processor of the PLD.

Figure 2:
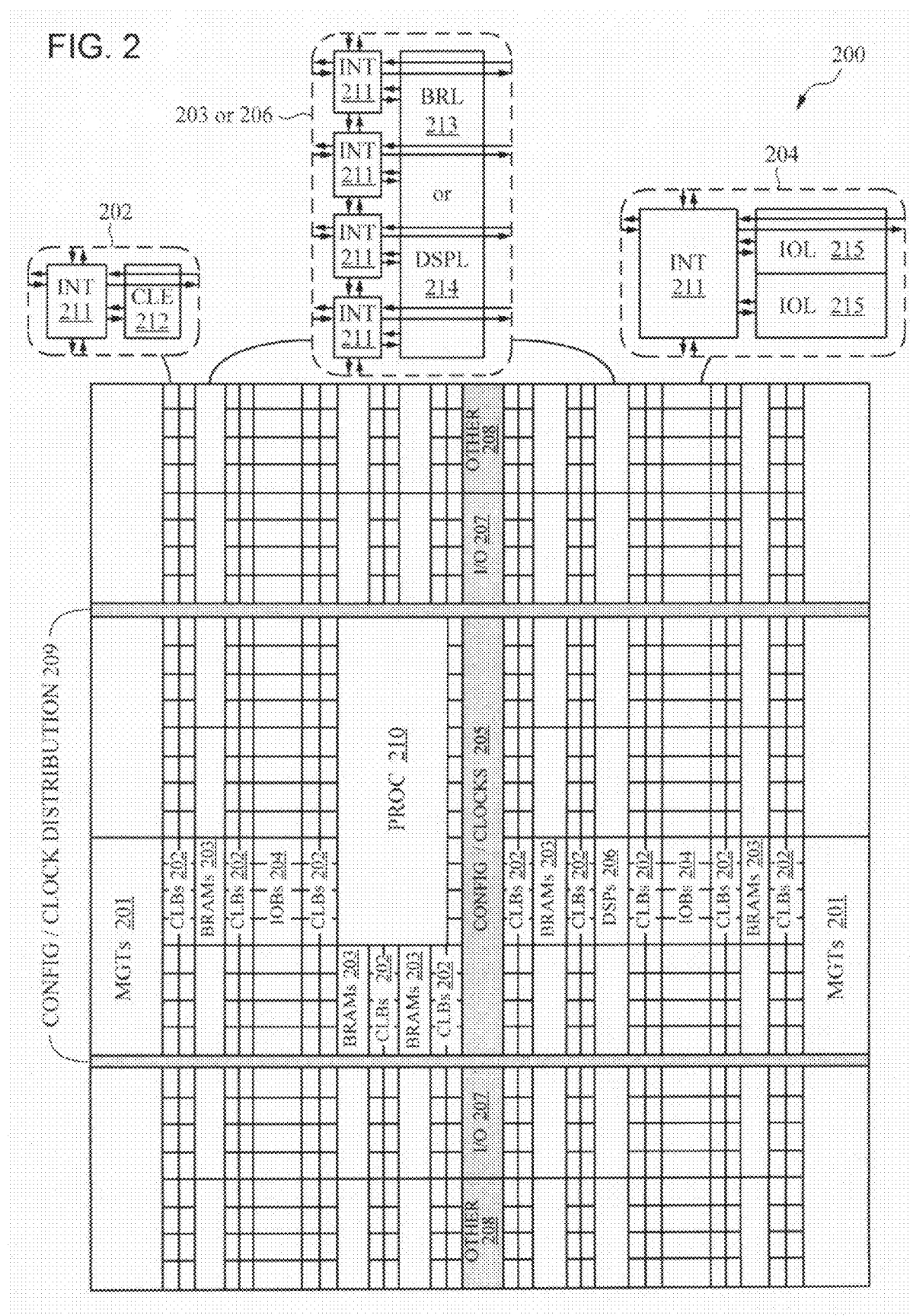
FIG. 2 is a block diagram of a programmable logic device that may be used to implement an electronic design in accordance with various embodiments of the invention.

FIG. 2 is a block diagram of a programmable logic device (PLD) that may be used to implement an electronic design in accordance with various embodiments of the invention. The PLD may be a field programmable gate array (FPGA) that includes an embedded processor 210 for implementing certain blocks of the electronic design and programmable resources for implementing certain other blocks of the electronic design.

Advanced FPGAs can include several different types of programmable logic blocks in an array. For example, FIG. 2 illustrates an FPGA architecture 200 that includes a large number of different programmable tiles including multi-gigabit transceivers (MGTs 201), configurable logic blocks (CLBs 202), random access memory blocks (BRAMs 203), input/output blocks (IOBs 204), configuration and clocking logic (CONFIG/CLOCKS 205), digital signal processing blocks (DSPs 206), specialized input/output blocks (I/O 207) (e.g., configuration ports and clock ports), and other programmable logic 208 such as digital clock managers, analog-to-digital converters, system monitoring logic, and so forth. Some FPGAs also include dedicated processor blocks (PROC 210).

In some FPGAs, each programmable tile includes a programmable interconnect element (INT 211) having standardized connections to and from a corresponding interconnect element in each adjacent tile. Therefore, the programmable interconnect elements taken together implement the programmable interconnect resources for the illustrated FPGA. The programmable interconnect element (INT 211) also includes the connections to and from the programmable logic element within the same tile, as shown by the examples included at the top of FIG. 2.

For example, a CLB 202 can include a configurable logic element (CLE 212) that can be programmed to implement user logic plus a single programmable interconnect element (INT 211). A BRAM 203 can include a BRAM logic element (BRL 213) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 206 can include a DSP logic element (DSPL 214) in addition to an appropriate number of programmable interconnect elements. An IOB 204 can include, for example, two instances of an input/output logic element (IOL 215) in addition to one instance of the programmable interconnect element (INT 211). As will be clear to those of skill in the art, the actual I/O pads connected, for example, to the I/O logic element 215 are manufactured using metal layered above the various illustrated logic blocks, and typically are not confined to the area of the input/output logic element 215.

In the pictured embodiment, a columnar area near the center of the die (shown shaded in FIG. 2) is used for configuration, clock, and other control logic. Horizontal areas 209 extending from this column are used to distribute the clocks and configuration signals across the breadth of the FPGA.

Some FPGAs utilizing the architecture illustrated in FIG. 2 include additional logic blocks that disrupt the regular columnar structure making up a large part of the FPGA. The additional logic blocks can be programmable blocks and/or dedicated logic. For example, the processor block PROC 210 shown in FIG. 2 spans several columns of CLBs and BRAMs.

Note that FIG. 2 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 2 are purely exemplary. For example, in an actual FPGA more than one adjacent column of CLBs is typically included wherever the CLBs appear, to facilitate the efficient implementation of user logic.

Figure 3:
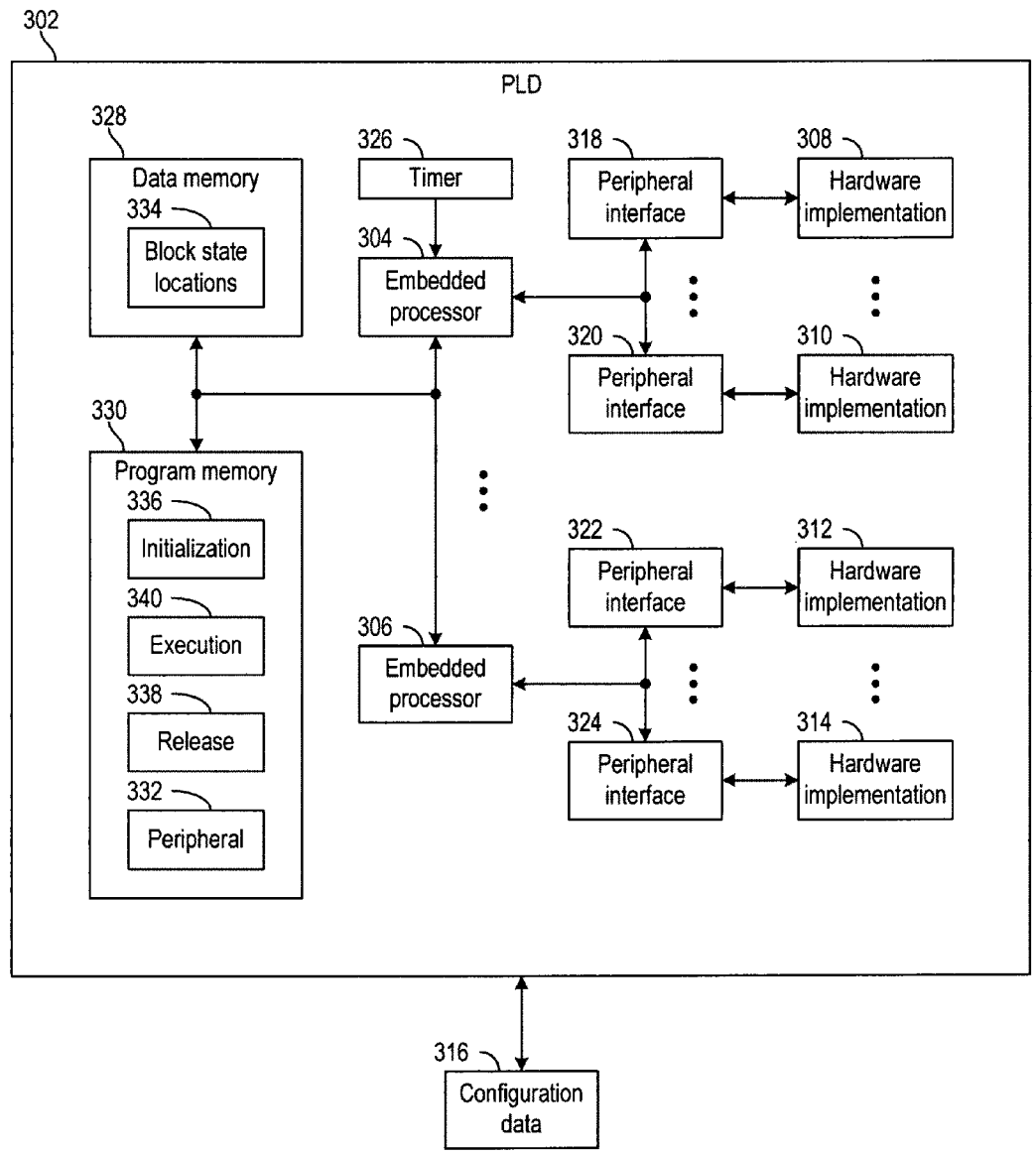
FIG. 3 is a block diagram of an electronic design implemented using a programmable logic device in accordance with various embodiments of the invention.

FIG. 3 is a block diagram of an electronic design implemented using a programmable logic device (PLD) 302 in accordance with various embodiments of the invention. Some blocks of the electronic design may be designated to have a software implementation executing on embedded processors 304 and 306, and the remaining blocks of the electronic design may be designated to have respective hardware implementations 308, 310, 312, and 314.

On power-up or reset of PLD 302, the programmable logic and interconnect resources of PLD 302 may be programmed with configuration data 316 to implement hardware implementations 308, 310, 312, and 314; peripheral interfaces 318, 320, 322, and 324; and timer 326. The configuration data 316 may also implement the memories 328 and 330 together with the initial contents and programmable parameters, such as the depth and width, of memories 328 and 330. In one embodiment, the configuration data 316 also implements the embedded processors 304 and/or 306 in the programmable logic and interconnect resources of the PLD 302. In another embodiment, embedded processors 304 and/or 306 are dedicated blocks of PLD 302.

The blocks of an electronic design may frequently include state storage registers. The data memory 328 may include locations 334 for storing the state of the registers of the software-implemented blocks. Because the data memory 328 may have a data width that does not match the width of a storage register of a software-implemented block of the electronic design, more than one of locations 334 or a portion of one of locations 334 may store the state of each register of each software-implemented block.

Each block of the electronic design that is designated for implementation in software may have a software implementation that includes three functions, an initialization function, an execution function, and an optional release function. The initialization module 336 may include invoke the initialization functions for all of the software-implemented blocks. Similarly, the optional release module 338 may free the state storage locations 334 in the data memory 328 by invoking the release functions for all of the software-implemented blocks. The initialization function may be invoked during reset of the electronic design and/or reset of the PLD 302 to provide an initial value for the locations 334 in the data memory 328. The release module 338 may be useful during reconfiguration of an electronic design. Electronic designs that are not reconfigurable may omit the release module 338.

The execution module 340 may invoke the execution functions for all of the software-implemented blocks. The execution functions may be invoked in an order that may depend on the connections between the blocks of the electronic design and the data rates of these connections. For example, a double rate block may generate an output at both a rising and failing edge of a clock signal of the electronic design and a normal rate block may generate an output only at a rising edge of the clock signal. The execution module 340 may include a scheduling function that includes two invocations of the execution function for the double rate block for each invocation of the execution function for the normal rate block.

For two connected blocks of the electronic design with one block implemented in software and the other block implemented in hardware, a peripheral interface may permit the exchange of data between the two blocks. For example, the electronic design may have a block with hardware implementation 308 and another block with a software implementation executing on embedded processor 304 of PLD 302. Communication between these two blocks of the electronic design may use peripheral interface 318 to transfer the data between the hardware implementation 308 and the embedded processor 304. The program memory 330 may include peripheral functions 332 that are software drivers for transferring data using the peripheral interfaces 318, 320, 322, and 324.

The HLMS may automatically select each peripheral interface 318, 320, 322, and 324 from a set of available peripheral interfaces. For example, the communication between embedded processor 304 and hardware implementation 308 may have a specified data transfer rate and an available peripheral interface with a matching bandwidth may be selected for peripheral interface 318. For a specific implementation of an electronic design, peripheral interfaces 318, 320, 322, and 324 may respectively be a FIFO, a dual port memory, a register, and a directly wired connection.

In one embodiment, embedded processors 304 and/or 306 may be periodically or occasionally interrupted by an interrupt from timer 326. For each timer interrupt of embedded processor 304, certain of the execution functions 340 may be evaluated for one or more blocks of the electronic design. Each evaluated execution function may generate the values of the outputs of the corresponding block from the stored state in data memory 328 and the inputs for the corresponding block. For an output that is connected to an input of a block implemented in, for example, hardware implementation 308, the generated output value may be transferred by one of peripheral functions 332 from embedded processor 304 to the hardware implementation 308 via peripheral interface 318. Peripheral interface 318 may include a temporary register for holding the generated output value, and an edge of a clock signal of the PLD 302 may transfer the value from the temporary register to an output register of the peripheral interface 318 that is connected to the appropriate input of the hardware implementation 308. Thus, the interrupts from timer 326 and the clocking of peripheral interfaces 318, 320, 322, and 324 may synchronize the generation and transfer of data between the software-implemented blocks and the hardware-implemented blocks.

In another embodiment, one or more of hardware implementations 308, 310, 312, and 314 may have a handshake signal or signals for transferring data between the software-implemented blocks and the hardware-implemented blocks. Using handshake signals may be useful when one block produces data that is consumed by the other block. For example, hardware implementation 312 may output a data valid signal to peripheral interface 322 whenever a value is generated for an output of the block implemented by hardware implementation 312. The peripheral interface 322 may respond to the data valid signal by generating an interrupt for embedded processor 306, and the embedded processor 306 may execute one of peripheral functions 332 to obtain the value from hardware implementation 312 via peripheral interface 322.

Alternatively, processor 306 may attempt to read a value for an output of the block implemented by hardware implementation 312, and the peripheral interface 322 will block the read attempt and suspend the operation of embedded processor 306 until hardware implementation 312 generates a data valid signal to indicate a value is available for an output of the block implemented by hardware implementation 312. To reduce the idling of embedded processor 306, peripheral interface 322 may be a queue with a buffer size selected by the HLMS or a user of the HLMS.

When embedded processor 306 transfers a generated output value to, for example, hardware implementation 314 via peripheral interface 324, peripheral interface 324 may provide a data valid signal to hardware implementation 314 to indicate the availability of the generated output value.

Figure 4:
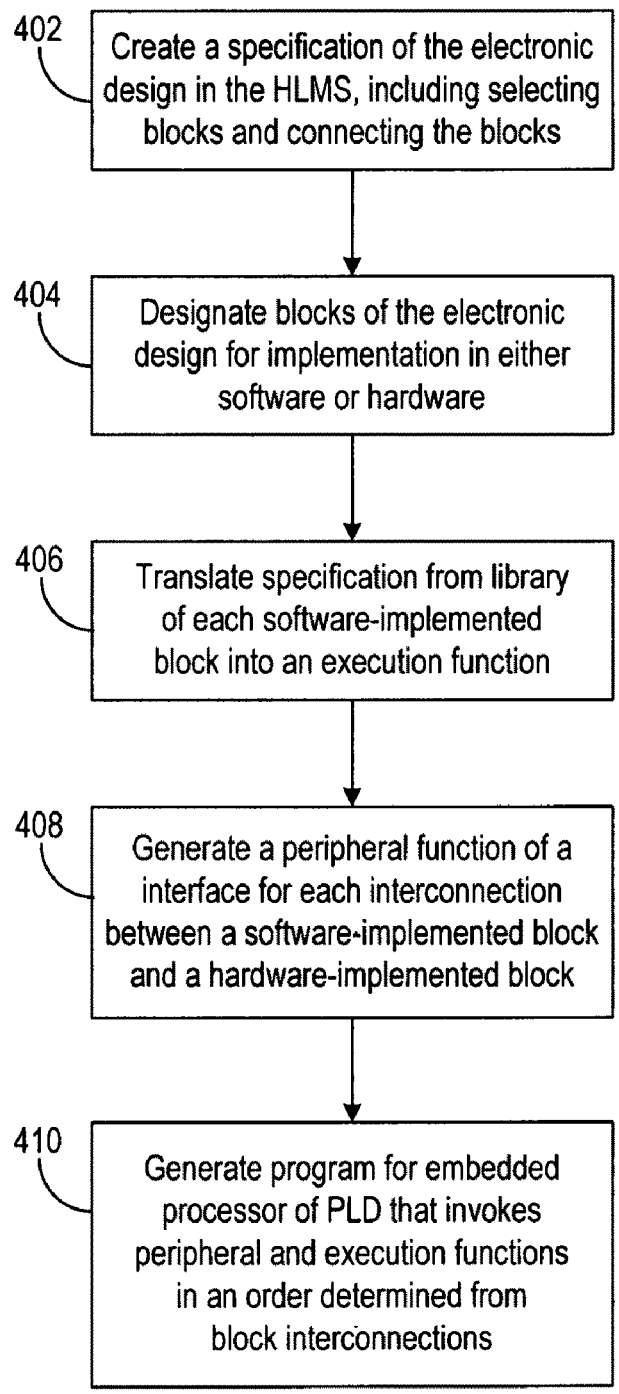
FIG. 4 is a flow diagram of a process for implementing an electronic design in a high-level modeling system in accordance with various embodiments of the invention.

FIG. 4 is a flow diagram of a process for implementing an electronic design in a high-level modeling system (HLMS) in accordance with various embodiments of the invention. The electronic design has an implementation in a PLD that uses a selectable combination of software and hardware.

At step 402, a specification of the electronic design is created in the HLMS. A user of the HLMS may create the specification of the electronic design by selecting blocks from one or more libraries and connecting ports of the blocks with interconnections. One or more of the blocks may be implemented in either software for an embedded processor on the PLD or in hardware on the PLD.

At step 404, each block may be designated for implementation in software or designated for implementation in hardware. A user may select the implementation of these blocks or the HLMS may automatically select the implementation of these blocks.

For each block that is designated for implementation in software, a specification of the block may be translated into an execution function of the software implementation of the block at step 406. The specification of the block may be obtained from the library from which the block was selected by the user at step 402.

At step 408, a peripheral function is generated for each of the interconnections of the electronic design that connects a block designated for hardware implementation with a block designated for software implementation. The peripheral function may be a software driver for an interface that couples the hardware implementation and the embedded processor that executes the software implementation and the peripheral function. The software implementation may invoke the peripheral function to transfer data between the embedded processor and the hardware implementation.

At step 410, a program is generated for the embedded processor of the PLD. The program may implement the electronic design in cooperation with the hardware implementations of the blocks designated for implementation in hardware. The program may invoke each peripheral function and each execution function in an order determined from the interconnections between the blocks.

Figure 5:
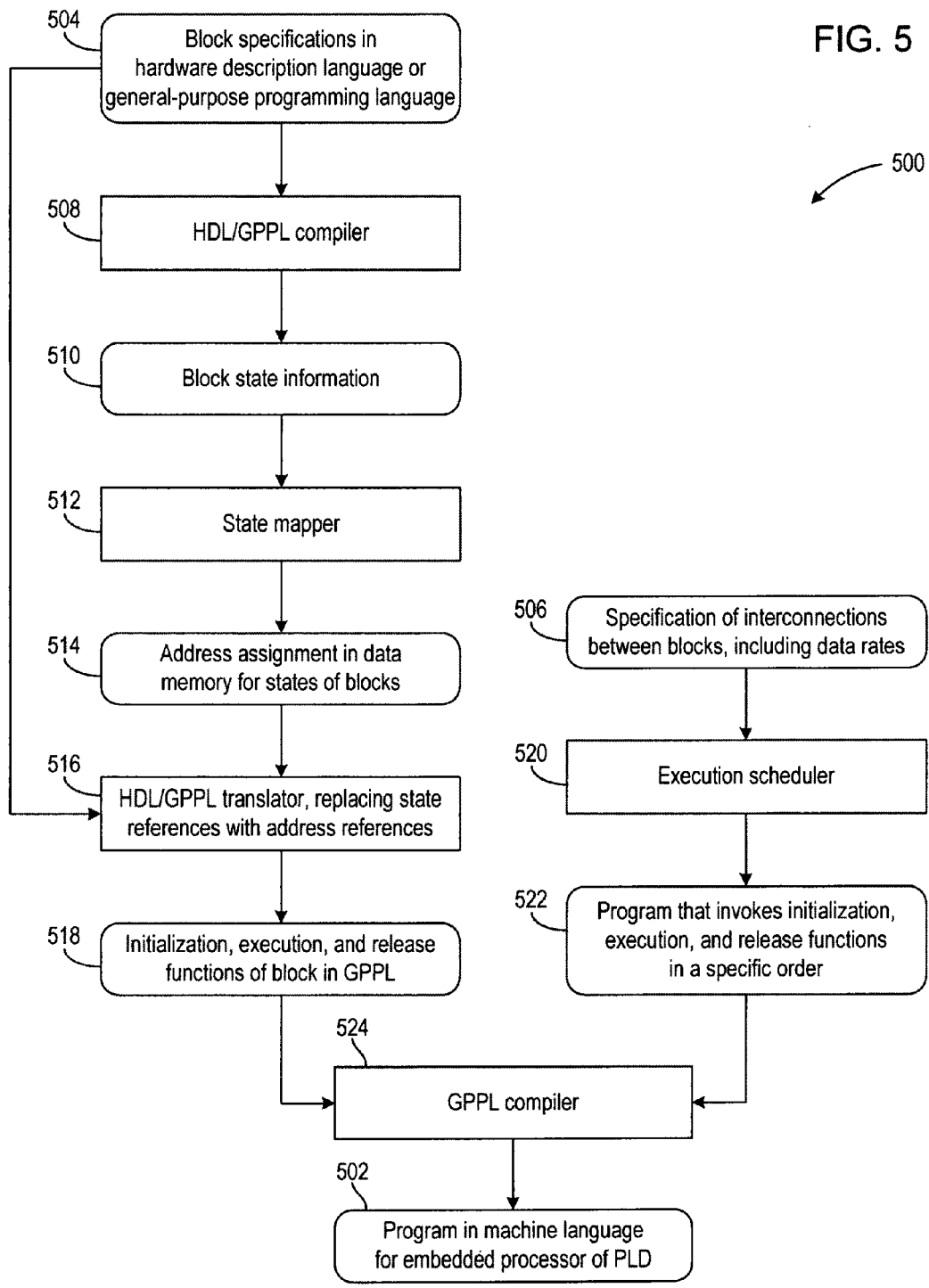
FIG. 5 is a data flow diagram of a process for generating a software program for implementing an electronic design in accordance with various embodiments of the invention.

FIG. 5 is a data flow diagram of a process 500 for generating a software program 502 for implementing an electronic design in accordance with various embodiments of the invention. The program 502 may implement the electronic design in cooperation with a hardware implementation of certain designated blocks of the electronic design, and the program 502 may execute on one or more embedded processors of a programmable logic device (PLD). The PLD may also include programmable logic and interconnect resources that may be configured to implement the blocks that are designated for implementation in hardware.

The program 502 may be generated in a high-level modeling system (HLMS) from specifications 504 of the blocks of the electronic design and specifications 506 of the interconnections between the blocks. Each block may be specified in specifications 504 using a general-purpose programming language, such as C, C++, or MATLAB programming languages, or a hardware description language, such as VHDL, Verilog, or SystemC. The specification 506 of the interconnections between blocks may specify the connections between the inputs and outputs of the blocks of the electronic design and the data transfer rates of the interconnections.

Certain types of blocks of an electronic design may only have a hardware implementation and consequently these types of blocks might not be designated for implementation in software. For example, a block of an electronic design that may be implemented in one of multi-gigabit transceivers 201 of FIG. 2 might not have a corresponding implementation in software. In various embodiments of the invention, at least one or frequently all of the blocks of an electronic design may be designated for implementation in either software or hardware.

For a block that may be designated for implementation in either software or hardware, the block may have a specification in block specifications 504 that is either a specification in a general purpose programming language or a specification in a hardware description language. A block may be designated for implementation in either software or hardware regardless of whether the block is specified in a general purpose programming language or in a hardware description language. For a block designated for implementation in hardware and having a specification in a general purpose programming language, the specification may be translated from the general purpose programming language to a hardware description language. Conversely, for a block designated for implementation in software and having a specification in a hardware description language, the specification may be translated from the hardware description language to a general purpose programming language. Thus, each block may have a single specification in block specifications 504 that may be used to generate either a software or hardware implementation of the block.

A compiler 508 may generate state information 510 for each block specified in specifications 504. For example, the HLMS may infer the registers of a block from a behavioral description of the block in Verilog, and the state information may be a name and a size of each inferred register. For another example, the HLMS may use a C compiler to compile a block specified in the C programming language, and the C compiler may provide a symbol table including the state information of the name and the type of each global variable and each static local variable. The block state information 510 may include the name and a size for the state vectors of the blocks specified in specifications 504.

A specification from block specifications 504 may have parameters that specify the detailed operation of the block. For example, a specification may allow the widths of the inputs and outputs of the block to be selected by a user or by the HLMS. The HLMS may set the widths of the inputs and outputs of a block to achieve the target data transfer rate for the block. In one embodiment of the invention, the values of the parameters may need to be determined before generating the block state information 510.

State mapper 512 of the HLMS may generate address assignments 514 for the state vectors of state information 510. Referring back to FIG. 3, each state vector of state information 510 may be assigned to the address of one or more of locations 334 in data memory 328. The state mapper 512 may determine a size of the data memory by collecting the block state information 510 for all of the blocks designated for implementation in software. The size of the data memory may determine the depth and/or width of the hardware implementation of the data memory.

Translator 516 may generate the initialization, execution, and release functions 518 in a general purpose programming language for the blocks from specifications 504 that are designated for implementation in software. Each reference to a state of each block may be replaced with a reference to an address of the data memory. For a specification from specifications 504 of a block that is already specified in a general purpose programming language, the translator 516 may limit the translation to replacing each state reference with a reference to the corresponding address in the data memory. For a specification from specification 504 of a block that is specified in a hardware description language, the translator 516 may translate the specification into the initialization, execution, and release functions in a general purpose programming language.

The execution scheduler 520 may determine updating rates for the inputs and outputs of the blocks designated for implementation in software. The execution scheduler 520 may generate a program 522 that invokes peripheral functions and the initialization, execution, and release functions 518 in a specific order that is dependent upon the update rates of the inputs and outputs of the blocks designated for implementation in software. Compiler 524 may compile the general purpose programming language of the program 522 and the functions 518 into the program 502 in a machine language of the embedded processor of the PLD.

It will be appreciated that for a PLD with multiple embedded processors, each of the blocks designated for implementation in software may be assigned to respective embedded processors, and process 500 a program may generate a similar program for each embedded processor.

Those skilled in the art will appreciate that various alternative computing arrangements, including one or more processors and a memory arrangement configured with program code, would be suitable for hosting the processes and data structures of the different embodiments of the present invention. In addition, the processes may be provided via a variety of computer-readable media or delivery channels such as magnetic or optical disks or tapes, electronic storage devices, or as application services over a network.

The present invention is thought to be applicable to a variety of high-level modeling systems. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A processor-implemented method for implementing an electronic design in a high-level modeling system (HLMS), comprising:
   creating a specification of the electronic design in the HLMS in response to user input, the creating of the specification including selecting a plurality of blocks from at least one library in response to the user input and connecting the blocks with a plurality of interconnections in response to the user input, wherein at least one of the blocks is available for implementation in a selectable one of a software implementation for an embedded processor on a programmable logic device (PLD) and a hardware implementation on the PLD;
   designating first and second subsets of the blocks of the electronic design, wherein each block of the first subset is designated for a software implementation on the embedded processor and each block of the second subset is designated for a hardware implementation on the PLD;
   for each block of the first subset, translating a specification of the block obtained from the at least one library into an execution function of the software implementation;
   for each interconnection of the electronic design that connects a block of the first subset and a block of the second subset, generating a peripheral function for an interface coupling the embedded processor to the hardware implementation of the block of the second subset; and
   generating a program for the embedded processor that invokes each peripheral function and each execution function in an order determined from the interconnections between the blocks.

2. The processor-implemented method of claim 1, wherein:
   the creating of the specification of the electronic design in the HLMS in response to the user input further includes specifying, in response to the user input, respective data rates for the interconnections and respective values for a plurality of parameters of the blocks of the electronic design; and
   the generating of the program for the embedded processor includes generating the program for the embedded processor that invokes each peripheral function and each execution function in the order determined from the interconnections between the blocks and the respective data rates for the interconnections.

3. The processor-implemented method of claim 1, wherein the designating of the first and second subsets of the blocks of the electronic design includes:
   displaying a choice selector for designating the first and second subsets of the blocks of the electronic design in response to the user input; and
   selecting an assignment of each block of the electronic design to one of the first and second subsets in response to the user input.

4. The processor-implemented method of claim 1, wherein the designating of the first and second subsets of the blocks of the electronic design includes the HLMS assigning one of the blocks of the electronic design to one of the first and second subsets in response to a processing rate of the embedded processor for the software implementation of the block, respective data transfer rates of a set of available interfaces for coupling the embedded processor to the hardware implementation of the block, respective data rates for the interconnections of the block, an estimate of usage of a plurality of programmable logic and interconnect resources of the PLD for each available interface in the set, and an estimate of usage of the programmable logic and interconnect resources for the hardware implementation of the block.

5. The processor-implemented method of claim 1, wherein the translating of the specification of each block of the first subset into the execution function of the software implementation of the block includes:
   translating the specification of the block in a hardware description language into another specification in a general-purpose programming language; and
   compiling the another specification into the execution function in a machine language of the embedded processor.

6. The processor-implemented method of claim 1, further comprising mapping a plurality of states of the blocks of the first subset to respective addresses in a data memory of the PLD.

7. The processor-implemented method of claim 6, wherein the mapping of the states of the blocks of first subset includes determining a size of the data memory for the mapping of the states of the blocks of the first subset.

8. The processor-implemented method of claim 7, further comprising generating configuration data for the PLD, wherein the configuration data configures the PLD to implement the data memory having the size, the hardware implementation for each block in the second subset, and, for each of the interconnections of the electronic design that connects a block of the first subset and a block of the second subset, the interface coupling the embedded processor to the hardware implementation of the block of the second subset.

9. The processor-implemented method of claim 8, wherein the configuration data further configures the PLD to implement a program memory, which is coupled to the embedded processor, for storing the program for the embedded processor.

10. The processor-implemented method of claim 6, wherein the translating of the specification of each block of the first subset into the execution function of the software implementation of the block includes:
translating the specification that includes at least one reference to a corresponding one of the states of the block into another specification of the block that replaces each of the at least one reference with a reference to the respective address of the corresponding state in the data memory; and
compiling the another specification into the execution function in a machine language of the embedded processor.

11. The processor-implemented method of claim 10, wherein the specification of the block and the another specification of the block are both specified in a general-purpose programming language.

12. The processor-implemented method of claim 6, wherein the translating of the specification of each block of the first subset into the execution function of the software implementation of the block includes, for each block of the first subset, generating an initialization function of the software implementation for initializing the data memory at the respective addresses of the states of the block.

13. The processor-implemented method of claim 12, wherein the generating of the program for the embedded processor includes generating the program for the embedded processor that invokes the initialization function for each block of the first subset before invoking each peripheral function and each execution function in the order determined from the interconnections between the blocks and respective data rates for the interconnections.

14. The processor-implemented method of claim 12, wherein the translating of the specification of each block of the first subset into the execution function of the software implementation of the block further includes, for each block of the first subset, generating a release function of the software implementation for freeing the respective addresses in the data memory of the states of the block.

15. The processor-implemented method of claim 1, wherein the generating of the program for the embedded processor includes generating the program for the embedded processor that invokes each peripheral function and each execution function in the order with a timing determined in response to a timer interrupt of the embedded processor.

16. The processor-implemented method of claim 1, wherein the generating of the program for the embedded processor includes generating the program for the embedded processor that invokes each peripheral function and each execution function in the order with a timing determined in response to at least one data handshake of the peripheral function of the interface for at least one of the interconnections connecting a block of the first subset and a block of the second subset.

17. The processor-implemented method of claim 1, further comprising:
designating a respective third subset of the blocks of the electronic design for each of at least one additional embedded processor of the PLD, wherein each block of the respective third subset is designated for a software implementation on the additional embedded processor of the PLD; and
generating a program for each of the at least one additional embedded processor that includes the software implementation of each block in the respective third subset for the additional embedded processor of the PLD.

18. A program storage medium, comprising:
a processor-readable device configured with instructions for implementing an electronic design in a high-level modeling system (HLMS), wherein execution of the instructions by one or more processors causes the one or more processors to perform operations including:
creating a specification of the electronic design in the HLMS in response to user input, the creating of the specification including selecting a plurality of blocks from at least one library in response to the user input and connecting the blocks with a plurality of interconnections in response to the user input, wherein at least one of the blocks is available for implementation in a selectable one of a software implementation for an embedded processor on a programmable logic device (PLD) and a hardware implementation on the PLD;
designating first and second subsets of the blocks of the electronic design, wherein each block of the first subset is designated for a software implementation on the embedded processor and each block of the second subset is designated for a hardware implementation on the PLD;
for each block of the first subset, translating a specification of the block obtained from the at least one library into an execution function of the software implementation of the block on the embedded processor;
for each of the interconnections of the electronic design that connects a block of the first subset and a block of the second subset, generating a peripheral function for an interface coupling the embedded processor to the hardware implementation of the block of the second subset; and
generating a program for the embedded processor that invokes each peripheral function and each execution function in an order determined from the interconnections between the blocks.

19. The program storage medium of claim 18, wherein the operations further include mapping a plurality of states of the blocks of the first subset to respective addresses in a data memory of the PLD, and the operation of the translating of the specification of each block of the first subset into the execution function of the software implementation of the block includes translating the specification that includes at least one reference to a corresponding one of the states of the block into another specification of the block that replaces each of the at least one reference with a reference to the respective address of the corresponding state in the data memory and compiling the another specification into the execution function in a machine language of the embedded processor.

20. A high-level modeling system (HLMS), comprising:
means for creating a specification of the electronic design in the HLMS in response to user input, the means for creating of the specification including means for selecting a plurality of blocks from at least one library in response to the user input and means for connecting the blocks with a plurality of interconnections in response to the user input, wherein at least one of the blocks is available for implementation in a selectable one of a software implementation for an embedded processor on a programmable logic device (PLD) and a hardware implementation on the PLD;

means for designating first and second subsets of the blocks of the electronic design, wherein each block of the first subset is designated for a software implementation on the embedded processor and each block of the second subset is designated for a hardware implementation on the PLD;

for each block of the first subset, means for translating a specification of the block obtained from the at least one library into an execution function of the software implementation of the block on the embedded processor;

for each of the interconnections of the electronic design that connects a block of the first subset and a block of the second subset, means for generating a peripheral function for an interface coupling the embedded processor to the hardware implementation of the block of the second subset; and means for generating a program for the embedded processor that invokes each peripheral function and each execution function in an order determined from the interconnections between the blocks.

* * * * *